(12) United States Patent
Moon (10) Patent No.: US 8,432,769 B2
(45) Date of Patent: Apr. 30, 2013

(54) SEMICONDUCTOR MEMORY DEVICE AND MEMORY SYSTEM HAVING THE SAME

(75) Inventor: Jinyeong Moon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 184 days.

(21) Appl. No.: 12/980,650

(22) Filed: Dec. 29, 2010

(65) Prior Publication Data

US 2012/0087201 A1    Apr. 12, 2012

(30) Foreign Application Priority Data

Oct. 11, 2010  (KR) .......................... 10-2010-0098803

(51) Int. Cl.
*G11C 8/18* (2006.01)

(52) U.S. Cl.
USPC .............. 365/233.18; 365/233.11; 365/233.1; 365/233.12; 365/233.19

(58) Field of Classification Search .............. 365/233.18, 365/233.11, 233.1, 233.12, 233.19
See application file for complete search history.

(56) References Cited

U.S. PATENT DOCUMENTS

2003/0031082 A1*  2/2003  Sawada .......................... 365/233

FOREIGN PATENT DOCUMENTS

KR  1020010045596  6/2001
KR  1020030078134  10/2003

OTHER PUBLICATIONS

Notice of Allowance issued by the Korean Intellectual Property Office on Apr. 17, 2012.

* cited by examiner

*Primary Examiner* — Thong Q Le
(74) *Attorney, Agent, or Firm* — IP & T Group LLP (57) ABSTRACT

A semiconductor memory device includes an internal clock signal generator configured to generate an internal clock signal by dividing a frequency of an external clock signal; a default latency determiner configured to determine a default latency in outputting a signal; and a latency reflector configured to, for each of consecutive commands, selectively add a half latency equal to a half cycle of the internal clock signal to the default latency in response to a half latency selection information signal.

36 Claims, 6 Drawing Sheets

SEMICONDUCTOR MEMORY DEVICE AND MEMORY SYSTEM HAVING THE SAME

CROSS-REFERENCE TO RELATED APPLICATIONS

The present application claims priority of Korean Patent Application No. 10-2010-0098803, filed on Oct. 11, 2010, which is incorporated herein by reference in its entirety.

BACKGROUND OF THE INVENTION

Exemplary embodiments of the present invention relate to a semiconductor device designing technology, and more particularly, to a semiconductor memory device and a semiconductor memory system including the same.

The operation speed and the integration degree of a semiconductor memory device such as a Dynamic Random Access Memory (DRAM) device continue to increase. In increasing the operation speed of the DRAM device, a Synchronous Dynamic Random Access Memory (SDRAM) device which may be operated in synchronization with an external clock signal input from the outside has been used. The initial form of the SDRAM device is a Single Data Rate (SDR) SDRAM device which input and output data in synchronization with a rising edge of an external clock signal to input/output data through a data pin.

To further increase the operation speed, a Double Data Rate (DDR) SDRAM device which processes two data in one clock cycle is being used. Here, the DDR SDRAM device is synchronized with both a rising edge and a falling edge of an external clock signal input from the outside to input/output two data consecutively. Therefore, although the frequency of the external clock signal is not increased, the DDR SDRAM device may realize at least twice the bandwidth of the conventional SDR SDRAM device and thus the DDR SDRAM device may operate at a high speed.

Examples of the DDR SDRAM device are a DDR2 SDRAM device, a DDR3 SDRAM device, and a DDR4 SDRAM device. A DDR SDRAM device performs a 2-bit prefetch operation during an input/output to support a burst length (BL) of two bit data, and a DDR2 SDRAM device performs a 4-bit prefetch operation during an input/output to support a burst length (EL) of four bit data. A DDR3 SDRAM device performs an 8-bit prefetch operation during an input/output to support a burst length (BL) of 8 bit data, and a DDR4 SDRAM device supports a burst length (EL) of 8 or 10 bit data. Here, the burst length of 10 bit data signifies that 10 bit data are consecutively input/output through a data pin in synchronization with a clock edge of an external clock signal. Hereafter, a scheme where a plurality of data is being input/output consecutively is referred to a burst transfer scheme.

Figure 1A:
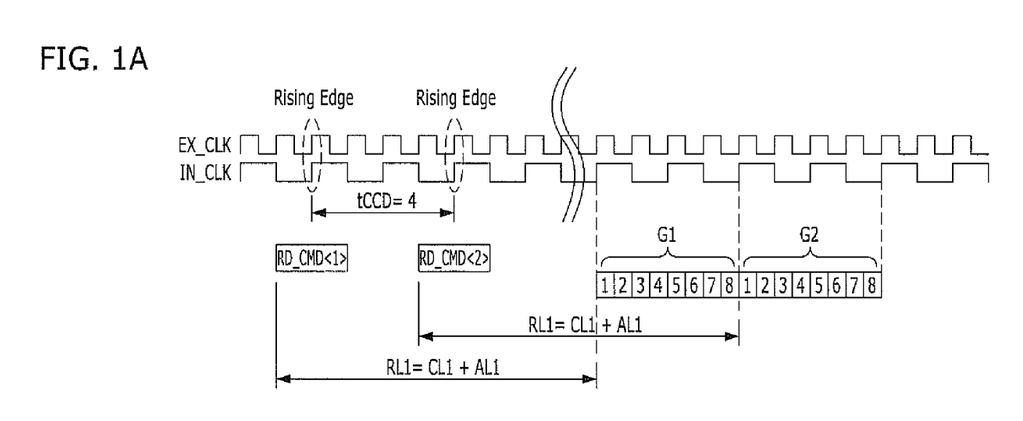
FIG. 1A is a timing diagram illustrating a burst transfer scheme based on an 8-bit burst length (BL8) transfer mode.
Figure 1B:
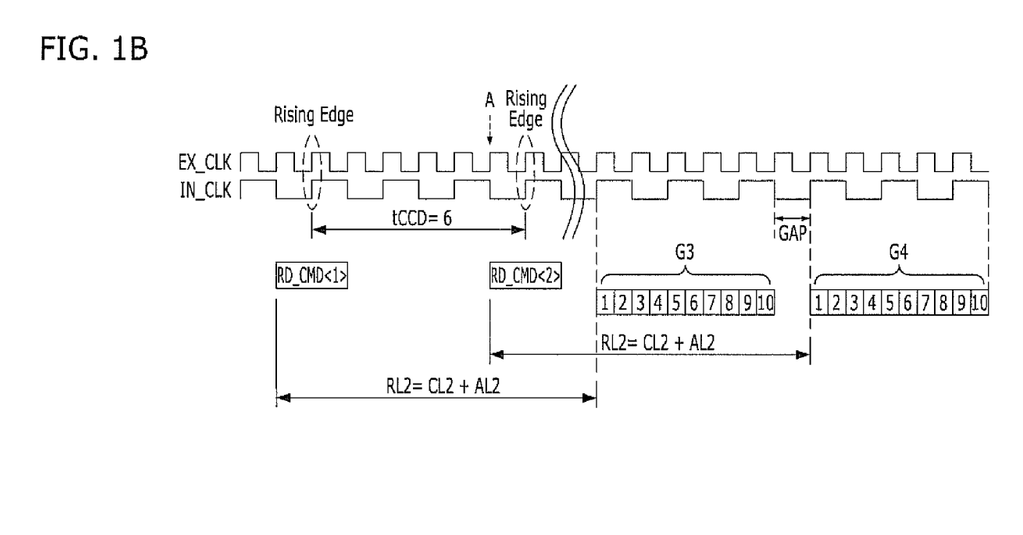
FIG. 1B is a timing diagram illustrating a burst transfer scheme based on a 10-bit burst length (BL10) transfer mode.

FIGS. 1A and 1B are timing diagrams illustrating a burst transfer scheme supported in a conventional DDR4 SDRAM device. FIG. 1A shows a timing diagram of a burst transfer scheme in an 8-bit burst length (BL8) transfer mode, and FIG. 1B shows a timing diagram of a burst transfer scheme in a 10-bit burst length (BL10) transfer mode.

Here, in describing the conventional technology of FIGS. 1A and 1B, a burst transfer scheme of a read operation is taken as an example, where an internal clock signal IN_CLK obtained by dividing the frequency of an external clock signal EX_CLK by 2 is used. Here, the frequency-divided internal clock signal IN_CLK is used to sufficiently secure the margins of read commands RD_CMD<1> and RD_CMD<2>.

Referring to FIG. 1A, in the 8-bit burst length (BL8) transfer mode, the clock gap (tCCD, which is CAS command to CAS Command delay) between the read commands RD_CMD<1> and RD_CMD<2> is set to 4 tCK, where tCK denotes one cycle of the external clock signal EX_CLK. Therefore, when the read commands RD_CMD<1> and RD_CMD<2> are input in synchronization with a rising edge of an internal clock signal IN_CLK, 8 bit read data G1 and G2 are sequentially output through a data pin after a read latency RL1, where the read latency RL1 is determined based on the time that a corresponding read command RD_CMD<1> or RD_CMD<2> is applied. Here, the read latency RL1 is defined as a sum of a CAS latency CL1 and an additive latency AL1.

Referring to FIG. 1B, in the 10-bit burst length (BL10) transfer mode, the clock gap tCCD between the read commands RD_CMD<1> and RD_CMD<2> is set to 6 tCK, where tCK denotes one cycle of the external clock signal EX_CLK. Therefore, when the read commands RD_CMD<1> and RD_CMD<2> are input in synchronization with a rising edge of an internal clock signal IN_CLK, 10 bit read data G3 and G4 are consecutively output through a data pin after a read latency RL2, where the read latency RL2 is determined based on the time that a corresponding read command RD_CMD<1> or RD_CMD<2> is applied.

The burst transfer scheme supported by the conventional DDR4 SDRAM device has the following features.

Referring to FIG. 1A, in the 8-bit burst length (BL8) transfer mode, the read data G1 and G2 may be sequentially output without a gap between the read data G1 and G2 that are consecutively output based on the consecutive read commands RDCMD<1> and RD_CMD<2>. In the 10-bit burst length (BL10) transfer mode, however, which is illustrated in FIG. 1B, there is a gap equal to 1 tCK between the read data G3 and G4 that are output corresponding to the consecutive read commands RD_CMD<1> and RD_CMD<2>, respectively. Due to such a gap in the 10-bit burst length (BL10) transfer mode, a decrease in the data transfer rate per unit time (which is bandwidth) may occur. If the clock gap tCCD between the read commands RD CMD<1> and RD_CMD<2> is set not to 6 tCK but to 5 tCK, the decrease in the data transfer rate per unit time may be prevented. However, the cycle of the internal clock signal IN_CLK does not work with the clock gap tCCD being equal to 5 tCK, the clock gap tCCD between the read commands RD_CMD<1> and RD_CMD<2> is not set to 5 tCK. This is because a portion A of the internal clock signal IN_CLK corresponding to 5 tCK of the external clock signal EX_CLK is not a rising edge just as in the external clock signal EX_CLK but a falling edge.

As described above, since the internal clock signal IN_CLK has a twice as wide clock cycle as the external clock signal EX_CLK, the internal clock signal IN_CLK may satisfy the clock gap tCCD between the read commands RD_CMD<1> and RD_CMD<2> corresponding to the even-number cycles of the external clock signal EX_CLK, such as 2 tCK, 4 tCK, 6 tCK and the like. Therefore, in case of the 10-bit burst length (BL10) transfer mode, since the clock gap tCCD between the read commands RD_CMD<1> and RD_CMD<2> is set to 6 tCK, a clock gap of 1 tCK occurs between the read data G3 and G4 that are consecutively output and thus the data transfer rate per unit time (which corresponds to bandwidth for data transfer) decreases.

SUMMARY OF THE INVENTION

An embodiment of the present invention is directed to a semiconductor memory device that may input/output column data corresponding to consecutive column commands without a clock gap between the column data when the column data are consecutively input/output, and a semiconductor memory system including the same.

In accordance with an embodiment of the present invention, a semiconductor memory device includes: an internal clock signal generator configured to generate an internal clock signal by dividing a frequency of an external clock signal; a default latency determiner configured to determine a default latency in outputting a signal; and a latency reflector configured to, for each of consecutive commands, selectively add a half latency equal to a half cycle of the internal clock signal to the default latency in response to a half latency selection information signal.

In accordance with another embodiment of the present invention, a semiconductor memory device includes: an internal clock signal generator configured to generate an internal clock signal by dividing a frequency of an external clock signal; a latency controller configured to determine a default read latency based on a default latency and a column address strobe (CAS) latency; a data output unit configured to latch read data corresponding to a burst length in response to each of consecutive read commands and sequentially output latched read data in response to the default read latency; a half latency selection information signal output unit configured to, for each of consecutive commands, latch a half latency selection information signal and output a latched half latency selection information signal in response to the default read latency; and a data output controller configured to selectively delay each of the latched read data that are sequentially output from the data output unit in response to an output signal of the half latency selection information signal output unit by a half latency equal to a half cycle of the internal clock signal and output the selectively delayed read data.

In accordance with yet another embodiment of the present invention, a semiconductor memory system with a semiconductor memory device for storing and providing data and a memory controller for controlling the semiconductor memory device includes: the memory controller configured to transfer an external clock signal and consecutive column commands to the semiconductor memory device, wherein the memory controller is configured to alternately transfer consecutive column commands to the semiconductor memory device with a first clock gap and a second clock gap between the column commands and transfer a half latency selection information signal for each of the consecutive column commands to the semiconductor memory device; and the semiconductor memory device configured to receive the external clock signal and the consecutive column commands, generate an internal clock signal by dividing a frequency of the external clock signal, and selectively add a half latency equal to a half cycle of the internal clock signal to a default read latency in response to the half latency selection information signal.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the embodiments of the present invention, a read path of a semiconductor memory device is taken as an example for the sake of convenience in describing the spirit and scope of the present invention. Also, in the embodiment of the present invention, a particular burst length transfer mode in which the data transfer rate per unit time (which corresponds to a bandwidth for data transfer), such as a 10-bit burst length (BL10) transfer mode is illustrated as an example. Here, the 10-bit burst length (BL10) transfer mode represents that the bits of data that are consecutively input/output through a data pin in synchronization with a clock edge of an external clock signal is 10.

Figure 2:
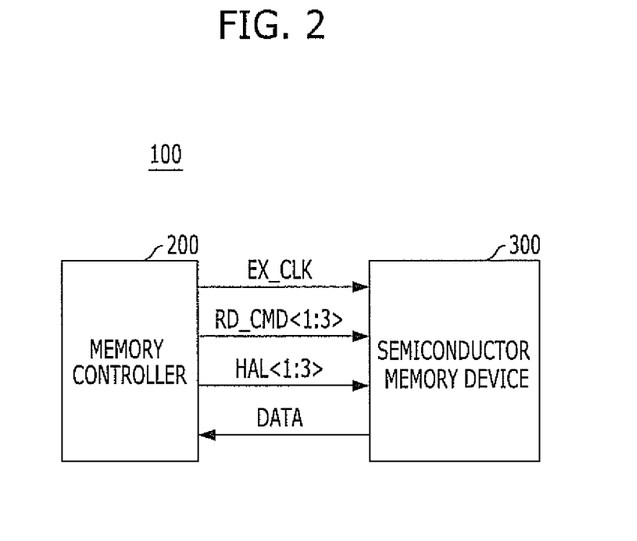
FIG. 2 is a block view illustrating a semiconductor memory system in accordance with an embodiment of the present invention.

FIG. 2 is a block view illustrating a semiconductor memory device and a semiconductor memory system including the semiconductor memory device in accordance with an embodiment of the present invention.

Referring to FIG. 2, the semiconductor memory system 100 includes a memory controller 200 for controlling a read path operation, and a semiconductor memory device 300 for providing a read data to the memory controller 200 under the control of the memory controller 200.

Here, the memory controller 200 transfers to the semiconductor memory device 300 an external clock signal EX_CLK and consecutive read commands RDCMD<1:3> to the semiconductor memory device 300 using a first clock gap and a second clock gap alternately in a particular burst length transfer mode and also transfers a half additive latency selection information signal HAL<1:3>, where HAL<1:3> is for each of the consecutive read commands RD_CMD<1:3>. Here, the first and second clock gaps correspond to '4 tCK' and '6 tCK' of the external clock signal EX_CLK, and the half additive latency selection information signal HAL<1:3> is updated for each of the consecutive read commands RD_CMD<1:3>.

Here, the semiconductor memory device 300 receives the external clock signal EX_CLK, the consecutive read commands RD_CMD<1:3>, and the half additive latency selection information signal HAL<1:3> from the memory controller 200 through respectively assigned pins, generates an internal clock signal IN_CLK which is a clock signal generated by dividing the frequency of the external clock signal EX_CLK by two, selectively adding a half additive latency HAL, which has a value corresponding to a half cycle of the internal clock signal IN_CLK, to a default read latency RL in response to the half additive latency selection information signal HAL<1:3>, where the default read latency RL is used in outputting a read data.

Figure 3:
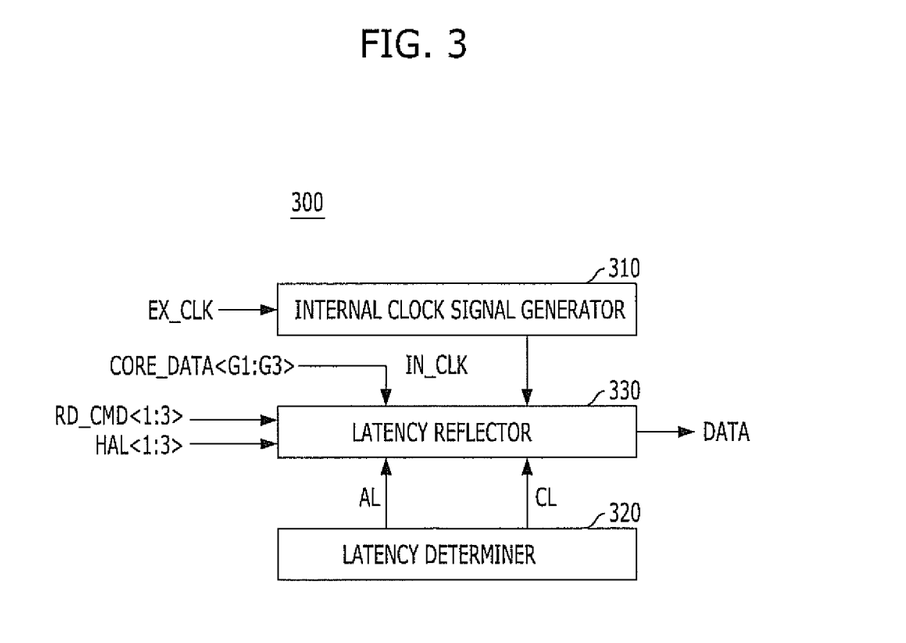
FIG. 3 is a block view illustrating a semiconductor memory device shown in FIG. 2.
Figure 4:
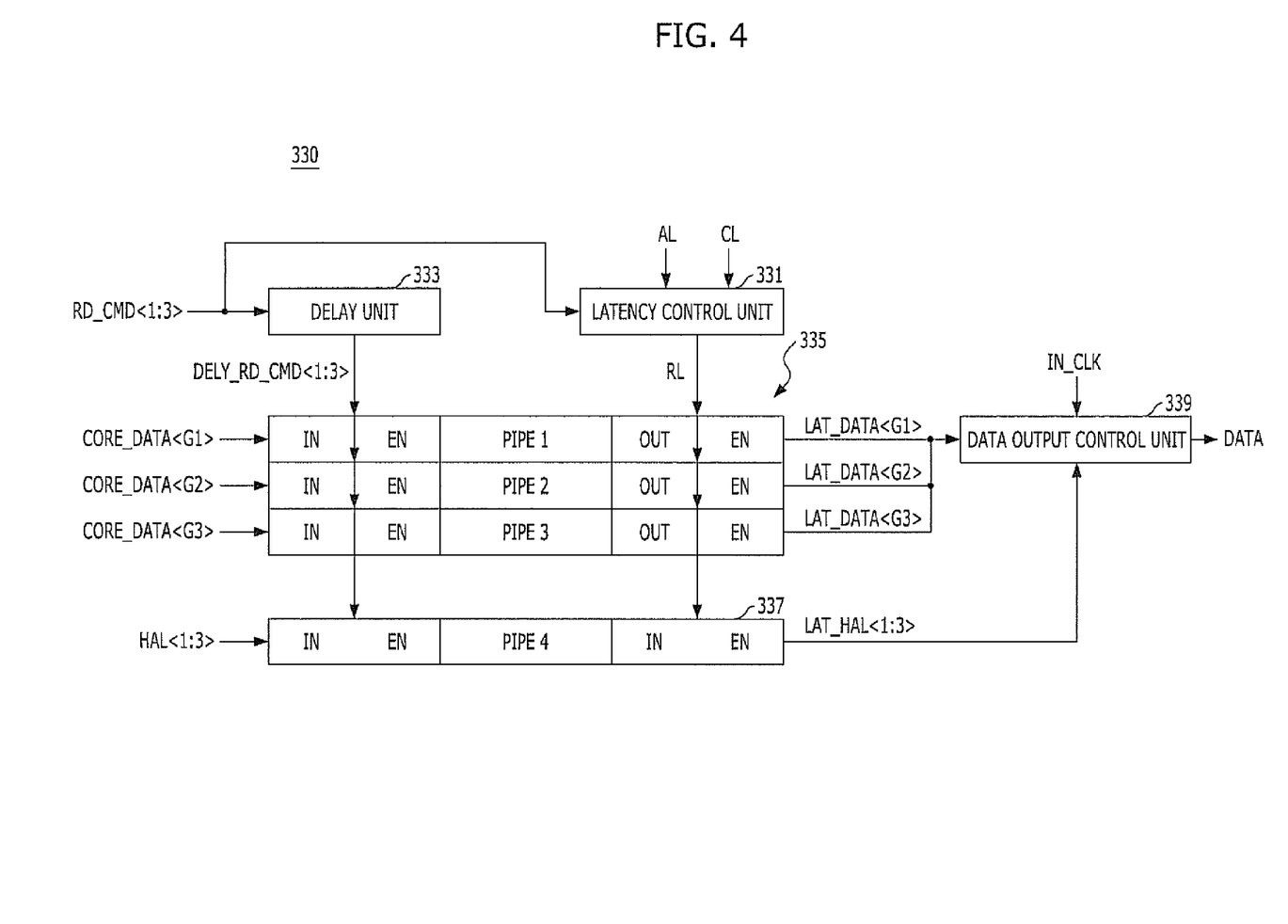
FIG. 4 is a block view illustrating a latency reflector shown in FIG. 3.
Figure 5:
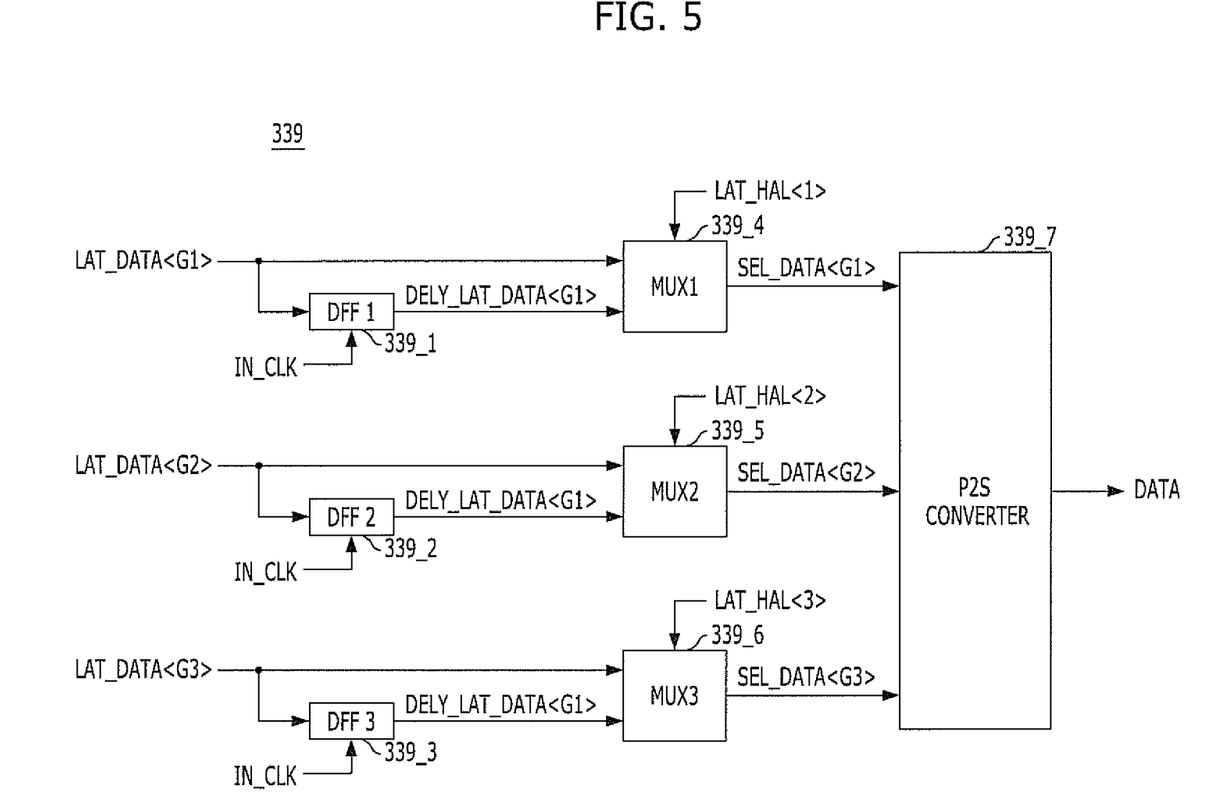
FIG. 5 is a block view illustrating a data output controller shown in FIG. 4.

FIG. 3 is a block view illustrating the semiconductor memory device 300 shown in FIG. 2. FIG. 4 is a block view illustrating a latency reflector 330 shown in FIG. 3. FIG. 5 is a block view illustrating a data output control unit 339 shown in FIG. 4.

Referring to FIG. 3, the semiconductor memory device 300 includes an internal clock signal generator 310, a latency determiner 320, and a latency reflector 330. The internal clock signal generator 310 generates an internal clock signal IN_CLK by dividing the frequency of an external clock signal EX_CLK. The latency determiner 320 sets a default additive latency AL and a default CAS latency CL. The latency reflector 330 receives read data CORE_DATA<G1:G3> from a memory cell (not shown) corresponding to the consecutive read commands RD_CMD<1:3>, selectively applies a half additive latency HAL to a default read latency RL according to a half additive latency selection information signal HAL<1:3> to reflect the half additive latency HAL in the input read data CORE_DATA<G1:G3> when the input read data CORE_DATA<G1:G3>is output to the memory controller 200. Here, the default read latency RL is defined as the sum of the default additive latency AL and the default CAS latency CL, and the internal clock signal generator 310 generates the internal clock signal IN_CLK by dividing the frequency of the external clock signal EX_CLK by two.

The default additive latency AL and the default CAS latency CL may be set by the memory controller 200 during the initial operation of the latency determiner 320, and the latency determiner 320 may be a Mode Register Set (MRS).

Also, as illustrated in FIG. 4, the latency reflector 330 includes a latency control unit 331, a data output unit 335, a half additive latency selection information signal output unit 337, and a data output control unit 339. The latency control unit 331 determines the default read latency RL based on the default additive latency AL and the default CAS latency CL in response to each of the consecutive read commands RD_CMD<1:3>. The data output unit 335 respectively latches the read data CORE_DATA<G1:G3> in response to delayed read commands DELY_RD_CMD<1:3> which are obtained by delaying the consecutive read commands RD_CMD<1:3> by an appropriate duration in a delay unit 333, and sequentially outputs latched read data LAT_DATA<G1:G3> in response to the default read latency RL.

The half additive latency selection information signal output unit 337 latches the half additive latency selection information signal HAL<1:3> in response to each of the delayed read commands DELY_RD_CMD<1:3> and outputs latched half additive latency selection information signal LAT_HAL<1:3> corresponding to the default read latency RL. The data output control unit 339 selectively delays the latched read data LAT_DATA<G1:G3> sequentially output from the data output unit 335 in response to the output signal LAT_HAL<1:3> of the half additive latency selection information signal output unit 337 and the internal clock signal IN_CLK by a delay equal to a half additive latency HAL and finally outputs a read data DATA corresponding to the consecutive read commands RD_CMD<1:3>.

Here, the data output unit 335 includes first to third pipe latches PIPE1, PIPE2 and PIPES for latching the read data CORE_DATA<G1:G3> corresponding to the consecutive read commands RD_CMD<1:3>, respectively. The half additive latency selection information signal output unit 337 may include a fourth pipe latch PIPE4 because the half additive latency selection information signal HAL<1:3> is input in real-time as it is produced.

The data output control unit 339, as illustrated in FIG. 5, includes first to third D-type flip flops 339_1, 339_2 and 339_3, first to third multiplexers 339_4, 339_5 and 339_6, and a parallel-to-serial (P2S) converter 339_7. The first to third D-type flip flops 339_1, 339_2 and 339_3 delay the latched read data LAT_DATA<G1:G3> output from the half additive latency selection information signal output unit 337 by a delay equal to the half additive latency HAL, which is a half cycle of the internal clock signal IN_CLK, and output a delayed read data DELY_LAT_DATA<G1:G3>. The first to third multiplexers 339_4, 339_5 and 339_6 selectively output any one of the latched read data LAT_DATA<G1:G3> respectively output from the half additive latency selection information signal output unit 337 in response to the half additive latency selection information signal HAL<1:3> and the delayed read data DELY_LAT_DATA<G1:G3> output from the first to third D-type flip flops 339_1, 339_2 and 339_3. The parallel-to-serial (P2S) converter 339_7 receives the output signals SEL_DATA<G1:G3> of the first to third multiplexers 339_4, 339_5 and 339_6 in parallel and serially outputs them.

Here, the first to third D-type flip flops 339_1, 339_2 and 339_3 initiate the output of the delayed read data DELY_LAT_DATA<G1:G3> not at a rising edge of the internal clock signal IN_CLK but at a falling edge of the internal clock signal IN_CLK, which is delayed by a half cycle. Here, any reasonably suitable delay circuit for delaying the internal clock signal IN_CLK by a half cycle and outputting a delayed internal clock signal IN_CLK may also be used for the first to third D-type flip flops 339_1, 339_2 and 339_3. 100391 The first to third multiplexers 339_4, 339_5 and 339_6 alternately select and output the latched read data LAT_DATA<G1:G3> and the delayed read data DELY_LAT_DATA<G1:G3> based on the half additive latency selection information signal HAL<1:3>. For example, the first multiplexer 339_4 selects and outputs the latched read data LAT_DATA<G1> in response to the latched half additive latency selection information signal LAT_HAL<1> of a logic low level, and the second multiplexer 339_5 selects and outputs the delayed read data DELY_LAT_DATA<G2> in response to the latched half additive latency selection information signal LAT_HAL<2> of a logic high level. The third multiplexer 339_6 selects and outputs the latched read data LAT_DATA<G3> in response to the latched half additive latency selection information signal LAT_HAL<3> of a logic low level.

Here, the parallel-to-serial (P2S) converter 339_7 receives in parallel the read data on which a delay operation selectively is performed, such as the latched read data LAT_DATA<G1> transferred from the first multiplexer 339_4, the delayed read data DELY_LAT_DATA<G2> transferred from the second multiplexer 339_5, and the latched read data LAT_DATA<G3> transferred from the third multiplexer 339_6, converts the received parallel read data into serial data, and transfers the final read data DATA to the memory controller 200.

Hereafter, the operations of the semiconductor memory device 300 fabricated according to the embodiment of the present invention and a semiconductor memory system 100 including the semiconductor memory device 300 are described with reference to FIGS. 6 and 7.

Figure 6:
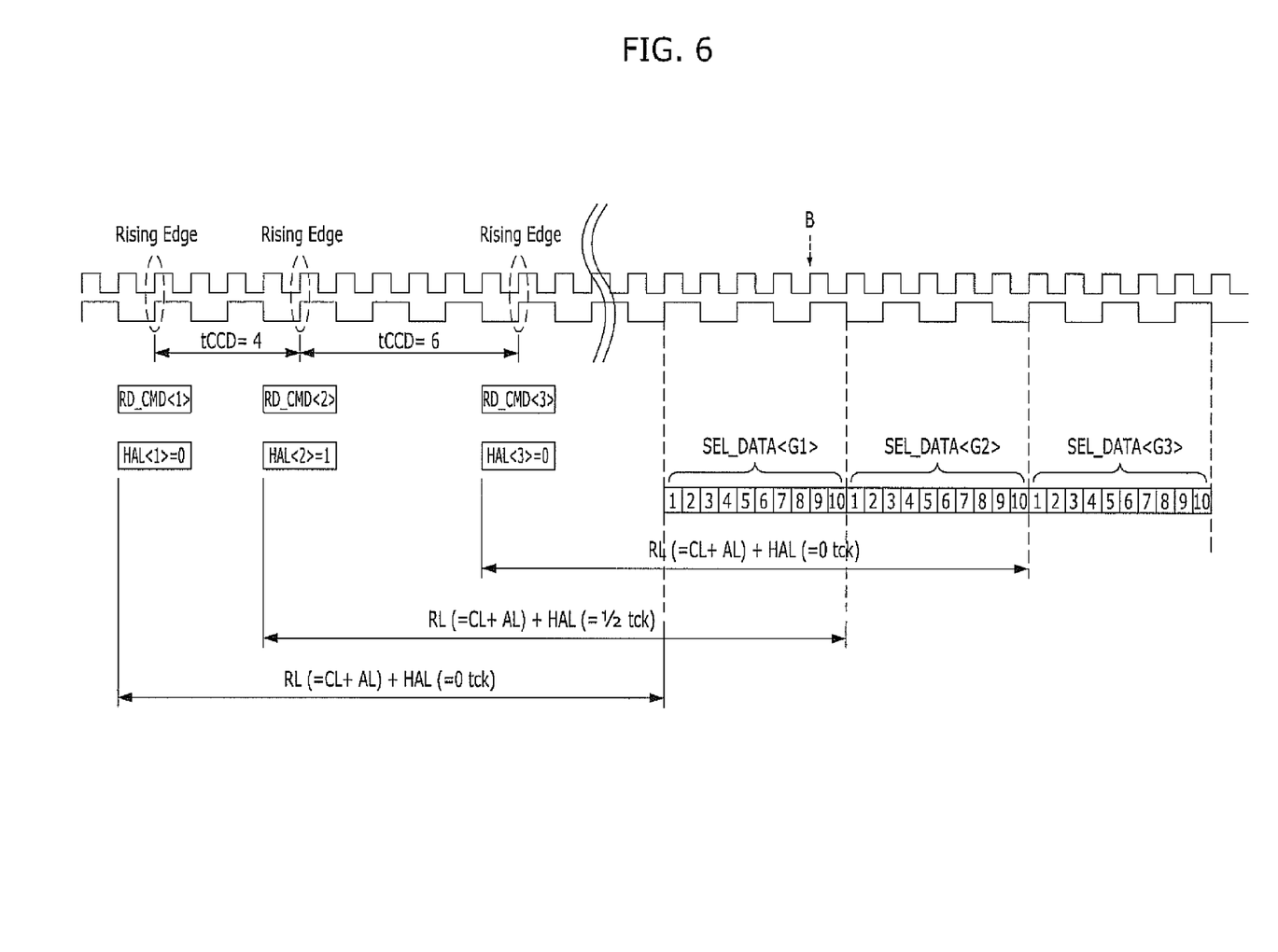
FIG. 6 is a timing diagram describing an operation of a semiconductor memory system based on a 10-bit burst length (BL10) transfer mode.
Figure 7:
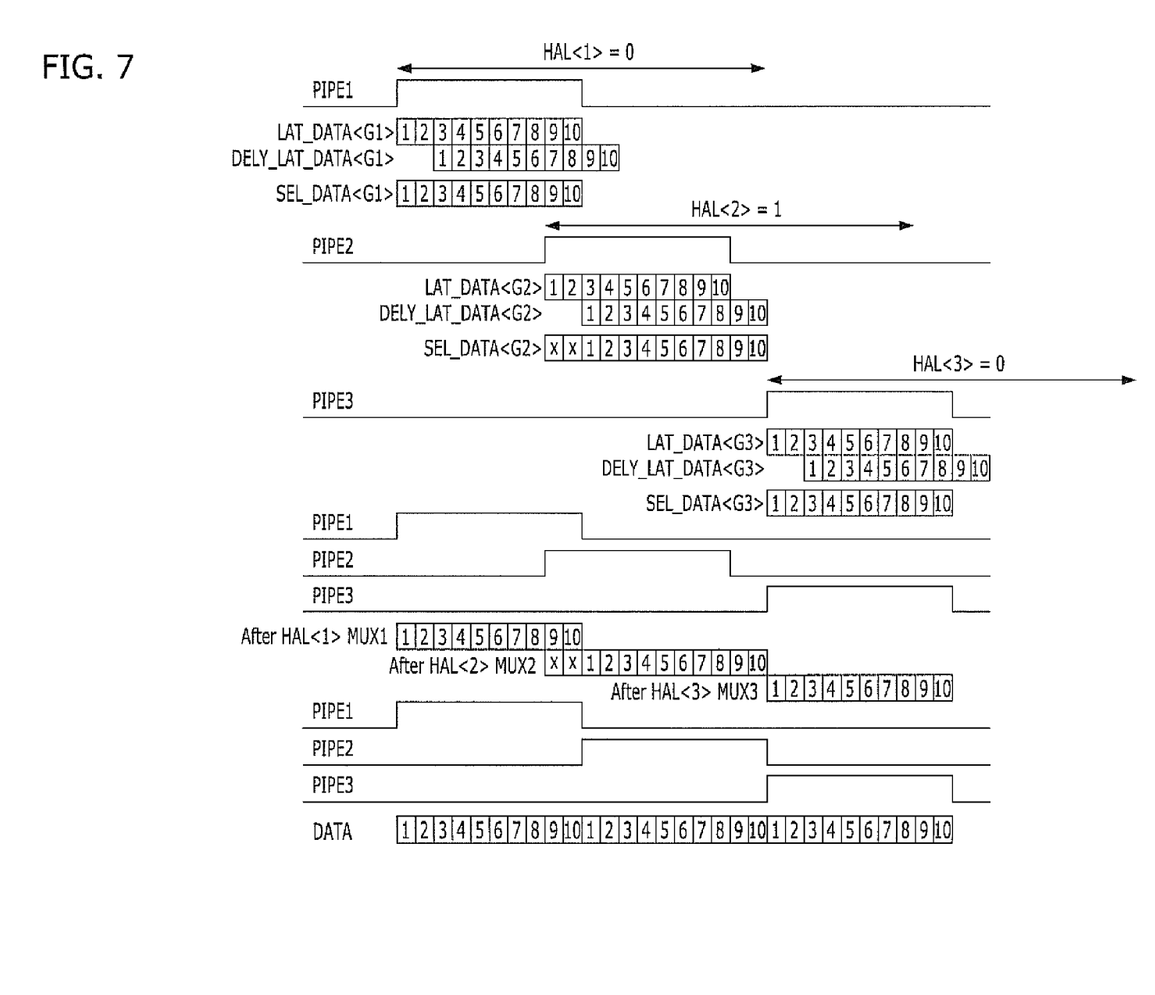
FIG. 7 is a timing diagram describing the timing diagram of FIG. 6 in detail.

FIG. 6 is a timing diagram describing an operation of the semiconductor memory system 100 based on a 10-bit burst length (BL10) transfer mode. FIG. 7 is a timing diagram describing the timing diagram of FIG. 6 in detail.

Referring to FIG. 6, first, a memory controller 200 transfers consecutive read commands RD_CMD<1:3> to the semiconductor memory device 300 in such a manner that the clock gap tCCD between the read commands is alternately set to be '4 tCK' and '6 tCK' of an external clock signal EX_CLK. More specifically, the memory controller 200 transfers the first read command RD_CMD<1>, and after 4 tCK passes from the time that the memory controller 200 transfers the first read command RD_CMD<1>, the memory controller 200 transfers the second read command RD_CMD<2>. After 6 tCK passes from the time that the memory controller 200 transfers the second read command RD_CMD<2>, the memory controller 200 transfers the third read command RD_CMD<3>. Although not illustrated in the drawings, if the memory controller 200 transfers the fourth read command and the fifth read command consecutively with the transfer of the first through third read commands RD_CMD<1:3>, the memory controller 200 transfers the fourth read command RD_CMD<4> after 4 tCK passes from the time that the memory controller 200 transfers the third read command RD_CMD<3> and transfers the fifth read command RD_CMD<5> after 6 tCK passes from the time that the memory controller 200 transfers the fourth read command RD_CMD<4>. This is to make the clock gap tCCD between the read commands to be operable with BL10 by using two clock gap units, and accordingly, the read data DATA transferred to the memory controller 200 in the 10-bit burst length (BL10) transfer mode does not have any gap between them in using clocks to transfer data.

Meanwhile, the memory controller 200 also transfers a half additive latency selection information signal HAL<1:3> which is updated according to each of the consecutive read commands RD_CMD<1:3> as well as transferring the consecutive read commands RD_CMD<1:3> to the semiconductor memory device 300. More specifically, the memory controller 200 transfers the half additive latency selection information signal HAL<1> of a logic low level while transferring the first read command RD_CMD<1>, transfers the half additive latency selection information signal HAL<2> of a logic high level while transferring the second read command RD_CMD<2>, and transfers the half additive latency selection information signal HAL<3> of a logic low level while transferring the third read command RD_CMD<3>. Although not illustrated in the drawings, if the memory controller 200 transfers the fourth and fifth read commands consecutively, the memory controller 200 transfers the half additive latency selection information signal HAL<1> of a logic high level while transferring the fourth read command RD_CMD<4> and transfers the half additive latency selection information signal HAL<2> of a logic low level while transferring the fifth read command RD_CMD<5>. In other words, the logic level of the half additive latency selection information signal HAL<1:3> shifts according to each of the consecutive read commands RD_CMD<1:3> and toggles as the number of the consecutive read commands RD_CMD<1:3> increases.

As described above, the memory controller 200 transfers the half additive latency selection information signal HAL<1:3> that is updated for each of the consecutive read commands RD_CMD<1:3> in real-time simultaneously with the transfer of the consecutive read commands RD_CMD<1:3> to the semiconductor memory device 300.

Then, the semiconductor memory device 300 transfers a read data SEL_DATA<G1> corresponding to the first read command RD_CMD<1> to the memory controller 200 without a delay. The semiconductor memory device 300 delays a read data SEL_DATA<G2> corresponding to the second read command RD_CMD<2> by a delay equal to a half cycle of the internal clock signal IN_CLK, which corresponds to '1 tCK' of the external clock signal EX_CLK, and transfers the delayed data to the memory controller 200. The semiconductor memory device 300 transfers a read data SEL_DATA<G3> corresponding to the third read command RD_CMD<3> to the memory controller 200 without a delay in response to the toggling half additive latency selection information signal HAL<1:3>. Here, the output of the read data SEL_DATA<G2> corresponding to the second read command RD_CMD<2> should substantially begin at timing point B that comes after a default read latency RL passes from the time that the second read command RD_CMD<2> is transferred, but since a half additive latency HAL is applied to the default read latency RL, the output of the read data SEL_DATA<G2> begins at a time delayed by a half cycle of the internal clock signal IN_CLK. Of course, the first and third read data SEL_DATA<G1> and SEL_DATA<G3> corresponding to the first and third read commands RD_CMD<1> and RD_CMD<3> begin to be output at a time when the half additive latency HAL is not applied and only the default read latency RL is applied.

Therefore, the semiconductor memory device 300 sequentially transfers the read data DATA corresponding to the consecutive read commands RD_CMD<1:3> to the memory controller 200 without a gap.

Hereafter, the timing diagram of FIG. 6 is described in detail with reference to FIG. 7.

Once the memory controller 200 transfers the consecutive read commands RD_CMD<1:3> and the half additive latency selection information signal HAL<1:3> respectively corresponding the consecutive read commands RD_CMD<1:3> to the semiconductor memory device 300, the semiconductor memory device 300 latches corresponding read data CORE_DATA<G1:G3> from an internal cell (not shown) in first to third pipe latches PIPE1, PIPE2 and PIPE3 included in the data output unit 335 and outputs latched read data LAT_DATA<G1:G3> to the data output control unit 339 after the default read latency RL passes from the time that each of the consecutive read commands RD_CMD<1:3> is transferred. Of course, the half additive latency selection information signal HAL<1:3> is also latched in the half additive latency selection information signal output unit 337 and then output to the data output control unit 339 after the default read latency RL.

The data output control unit 339 sequentially transfers the read data DATA corresponding to the consecutive read commands RD CMD<1:3> to the memory controller 200 without a delay by alternately delaying the latched read data LAT_DATA<G1:G3>. More specifically, the first to third D-type flip flops 339_1, 339_2 and 339_3 delay the latched read data LAT_DATA<G1:G3> by a delay equal to a half cycle of the internal clock signal IN_CLK to generate delayed read data DELY_LAT_DATA<G1:G3>, and the first to third multiplexers 339_4, 339_5 and 339_6 select one of the respective latched read data LAT_DATA<G1:G3> and the delayed read data DELY_LAT_DATA<G1:G3> based on the half additive latency selection information signal HAL<1:3> and outputs the selected read data. For example, the first multiplexer 339_4 selects the latched read data LAT_DATA<G1> in response to the latched half additive latency selection information signal LAT_HAL<1> of a logic low level and outputs it as a selected read data SEL_DATA<G1>. The second multiplexer 339_5 selects the delayed read data DELY_LAT_DATA<G2> in response to the latched half additive latency selection information signal LAT_HAL<2> of a logic high level and outputs it as a selected read data SEL_DATA<G2>. The first multiplexer 339_6 selects the latched read data LAT_DATA<G3> in response to the latched half additive latency selection information signal LAT_HAL<3> of a logic low level and outputs it as a selected read data SEL_DATA<G3>. Accordingly, the parallel-to-serial converter 339_7 receives in parallel the selected read data SEL_DATA<G1>, SEL_DATA<G2> and SEL_DATA<G3> that are selected and output from the first to third multiplexers 339_4, 339_5 and 339_6, converts the parallel data into serial data, and sequentially transfers read data DATA corresponding to the consecutive read commands RD_CMD<1:3> without a gap to the memory controller 200.

Meanwhile, although the semiconductor memory device and the semiconductor memory system according to the embodiment of the present invention have been described in the 10-bit burst length (BL10) transfer mode, the technology of the present invention may be applied to a 4-burst length (BL4) transfer mode and an 8-bit burst length (BL8) transfer mode as well. More specifically, in the 4-burst length (BL4) transfer mode and the 8-bit burst length (BL8) transfer mode, the memory controller 200 transfers the consecutive read commands RD_CMD<1:3> with a uniform clock gap tCCD between them and it does not transfer the half additive latency selection information signal HAL<1:3> which toggles for each of the consecutive read commands RD_CMD<1:3> but transfers a half additive latency selection information signal HAL<1:3> having a same logic level for the consecutive read commands RD_CMD<1:3>. Then, the data output control unit 339 outputs the read data DATA in a state where the half additive latency HAL is not applied to the default read latency RL.

According to an exemplary embodiment of the present invention described above, since the read data corresponding to the consecutive read commands are output consecutively without a gap, an appropriate data transfer rate per unit time, which is bandwidth, may be obtained.

According to an exemplary embodiment of the present invention, an appropriate data transfer rate per unit time (which corresponds to a bandwidth for data transfer) may be obtained by inputting/outputting column data corresponding to consecutive column commands without a gap when the column data are input/output consecutively in a burst length transfer mode such as a 10-bit burst length (BL10) transfer mode.

While the present invention has been described with respect to the specific embodiments, it will be apparent to those skilled in the art that various changes and modifications may be made without departing from the spirit and scope of the invention as defined in the following claims.

For example, a read path operation is taken as an example to describe the embodiment of the present invention, but the technology of the present invention may be applied to a write path operation as well.

What is claimed is:

1. A semiconductor memory device, comprising:
an internal clock signal generator configured to generate an internal clock signal by dividing a frequency of an external clock signal;
a default latency determiner configured to determine a default latency in outputting a signal; and
a latency reflector configured to control a corresponding latency for each of consecutive commands, by selectively adding a half latency equal to a half cycle of the internal clock signal to the default latency in response to a half latency selection information signal.

2. The semiconductor memory device of claim 1, wherein the internal clock signal is a clock signal obtained by dividing a frequency of the external clock signal by two.

3. The semiconductor memory device of claim 1, wherein in a 4-bit burst length transfer mode or an 8-burst length (BL8) transfer mode, clock gaps between transfers of the consecutive commands are the same.

4. The semiconductor memory device of claim 3, wherein the latency reflector is configured to latch data in response to the default latency, not to delay the latched data by a delay equal to one clock cycle of the external clock signal, and to output the latched data or the delayed latched data in response to the half latency selection information signal.

5. The semiconductor memory device of claim 1, wherein in a 10-bit burst length (BL10) transfer mode, the consecutive commands are alternately transferred with a first gap and a second gap different from the first gap between consecutive ones of the consecutive commands.

6. The semiconductor memory device of claim 5, wherein the first clock gap and the second clock gap correspond to four and six clock cycles of the external clock signal, respectively.

7. The semiconductor memory device of claim 5, wherein the latency reflector is configured to selectively add the half latency to the default latency for alternative ones of the commands.

8. The semiconductor memory device of claim 1, wherein the latency reflector is configured to add the half latency to the default latency when the clock gap between the commands is four clock cycles of the external clock signal.

9. The semiconductor memory device of claim 1, wherein the latency reflector is configured not to add the half latency to the default latency when the clock gap between the commands is six clock cycles of the external clock signal.

10. The semiconductor memory device of claim 1, wherein the latency reflector is configured not to add the half latency to the default latency for the first occurring command among the consecutive commands.

11. The semiconductor memory device of claim 1, wherein the default latency is set through a mode register set (MRS).

12. The semiconductor memory device of claim 1, wherein the half latency selection information signal is applied through a pin.

13. A semiconductor memory device, comprising:
an internal clock signal generator configured to generate an internal clock signal by dividing a frequency of an external clock signal;
a latency controller configured to determine a default read latency based on a default latency and a column address strobe (CAS) latency;
a data output unit configured to latch read data corresponding to a burst length in response to each of consecutive read commands and sequentially output latched read data in response to the default read latency;
a half latency selection information signal output unit configured to, for each of consecutive commands, latch a half latency selection information signal and output a latched half latency selection information signal in response to the default read latency; and
a data output controller configured to selectively delay each of the latched read data that are sequentially output from the data output unit in response to an output signal of the half latency selection information signal output unit by a half latency equal to a half cycle of the internal clock signal and output the selectively delayed read data.

14. The semiconductor memory device of claim 13, wherein the internal clock signal is a clock signal obtained by dividing a frequency of the external clock signal by two.

15. The semiconductor memory device of claim 13, wherein the data output unit comprises a plurality of pipe latches for latching the read data corresponding to the consecutive read commands.

16. The semiconductor memory device of claim 13, wherein the data output controller comprises:
a plurality of delay circuits for delaying the latched read data output from the plurality of the pipe latches by a delay equal to the half latency and outputting delayed read data;
a plurality of multiplexers for selectively outputting the latched read data output from the plurality of the pipe latches and the delayed read data output from the plurality of the delay circuits in response to an output signal of the half latency selection information signal output unit; and
a parallel-to-serial converter for receiving the output signals of the plurality of the multiplexers in parallel and serially outputting the received output signals.

17. The semiconductor memory device of claim 13, wherein in a 4-bit burst length transfer mode or an 8-bit burst length transfer mode, clock gaps between transfers of the consecutive read commands are the same.

18. The semiconductor memory device of claim 17, wherein the data output controller is configured to receive the internal clock signal and not to delay each of the latched read data in response to the internal clock signal.

19. The semiconductor memory device of claim 13, wherein in a 10-bit burst length transfer mode, the consecutive read commands are alternately transferred with a first gap and a second gap different from the first gap between the consecutive read commands.

20. The semiconductor memory device of claim 19, wherein the first clock gap and the second clock gap correspond to four and six clock cycles of the external clock signal, respectively.

21. The semiconductor memory device of claim 19, wherein the data output controller is configured to delay and output the read data output from the data output unit in response to alternative ones of the consecutive read commands.

22. The semiconductor memory device of claim 20, wherein the data output controller is configured to delay the read data output from the data output unit by a delay equal to the half latency and output delayed read data when the clock gap between the consecutive read commands is four clock cycles of the external clock signal and the data output controller is configured to output the read data output from the data output unit without the delay when the clock gap between the read commands is six clock cycles of the external clock signal.

23. The semiconductor memory device of claim 22, wherein the data output controller is configured to output the latched read data output from the data output unit without the delay for the first occurring read command among the consecutive read commands.

24. The semiconductor memory device of claim 13, wherein the default latency and the CAS latency are set through a mode register set (MRS).

25. The semiconductor memory device of claim 13, wherein the half latency selection information signal is applied through a pin.

26. A semiconductor memory system with a semiconductor memory device for storing and providing data and a memory controller for controlling the semiconductor memory device, comprising:
the memory controller configured to transfer an external clock signal and consecutive column commands to the semiconductor memory device, wherein the memory controller is configured to alternately transfer consecutive column commands to the semiconductor memory device with a first clock gap and a second clock gap between the column commands and transfer a half latency selection information signal for each of the consecutive column commands to the semiconductor memory device; and
the semiconductor memory device configured to receive the external clock signal and the consecutive column commands, generate an internal clock signal by dividing a frequency of the external clock signal, and selectively add a half latency equal to a half cycle of the internal clock signal to a default read latency in response to the half latency selection information signal.

27. The semiconductor memory system of claim 26, wherein the semiconductor memory device comprises:
an internal clock signal generator configured to generate the internal clock signal by dividing the frequency of the external clock signal by two;
a default latency determiner configured to determine the default read latency; and
a latency reflector configured to add the half latency to the default latency in response to the half latency selection information signal.

28. The semiconductor memory system of claim 26, wherein the particular burst length transfer mode is a 10-bit burst length transfer mode.

29. The semiconductor memory system of claim 28, wherein the first clock gap and the second clock gap correspond to four and six clock cycles of the external clock signal, respectively.

30. The semiconductor memory system of claim 29, wherein the semiconductor memory device is configured to add the half latency to the default latency when the column commands has a clock gap equal to four clock cycles but not when the column commands has a clock gap equal to six clock cycles.

31. The semiconductor memory system of claim 30, wherein the semiconductor memory device is configured not to add the half latency to the default latency in response to the half latency selection information signal corresponding to the first occurring column command among the consecutive column commands.

32. The semiconductor memory system of claim 26, wherein the memory controller is configured to
transfer the consecutive column commands with a uniform clock gap when the memory controller transfers the consecutive column commands, and transfer a half latency selection information signal that has the same logic level for each of the consecutive column commands.

33. The semiconductor memory system of claim 32, wherein the memory controller is configured to transfer of the consecutive column commands with the uniform clock gap in a 4-bit burst length transfer mode or an 8-bit burst length transfer mode.

34. The semiconductor memory system of claim 33, wherein the semiconductor memory device is configured to latch data in response to the default latency, not to delay the latched data by a delay equal to one clock cycle of the external clock signal, and to output the latched data or the delayed latched data in response to the half latency selection information signal.

35. The semiconductor memory system of claim 26, wherein the default latency is set through a mode register set (MRS).

36. The semiconductor memory system of claim 26, wherein the half latency selection information signal is applied consecutively through a pin.

* * * * *